United States Patent [19]

Temple et al.

[11] Patent Number: 4,648,174

[45] Date of Patent: Mar. 10, 1987

[54] METHOD OF MAKING HIGH BREAKDOWN VOLTAGE SEMICONDUCTOR DEVICE

[75] Inventors: Victor A. K. Temple, Saratoga; Wirojana Tantraporn, Schenectady, both of N.Y.

[73] Assignee: General Electric Company, Schenectady, N.Y.

[21] Appl. No.: 698,495

[22] Filed: Feb. 5, 1985

[51] Int. Cl.[4] .................................................. H01L 21/26
[52] U.S. Cl. ......................................... 29/578; 148/171;
148/DIG. 106; 148/DIG. 145; 427/43.1;
357/13
[58] Field of Search ......... 29/578; 148/171, DIG. 106,
148/DIG. 145; 427/43.1; 430/5; 357/13, 90, 52

[56] References Cited

U.S. PATENT DOCUMENTS

| | | | |
|---|---|---|---|
| 3,341,380 | 9/1967 | Mets et al. | 357/13 |
| 3,436,282 | 4/1969 | Shoda | 148/DIG. 106 |
| 4,153,904 | 5/1979 | Tasch, Jr. et al. | 357/90 |

Primary Examiner—Brian E. Hearn
Assistant Examiner—John T. Callahan
Attorney, Agent, or Firm—John R. Rafter; Davis, Jr., James C.; Marvin Snyder

[57] ABSTRACT

A multiple-zone junction termination extension region is formed adjacent a reverse-blocking junction in a semiconductor device to increase the breakdown voltage of such device. A single mask is used to form the multiple-zone JTE region, with the mask having different patterns of openings in the different zones of the mask. Adjacent openings are maintained with a center-to-center spacing of less than 25 percent of the depletion width of the reverse-blocking junction in a voltage-supporting semiconductor layer adjoining the reverse-blocking junction at the ideal breakdown voltage of the junction. As a consequence, the resulting non-uniformities in doping of the various zones of the JTE region are negligibly small. An alternative JTE region is finely-graduated in dopant level from one end of the region to the other, as opposed to having multiple zones of discrete doping levels.

10 Claims, 5 Drawing Figures

METHOD OF MAKING HIGH BREAKDOWN VOLTAGE SEMICONDUCTOR DEVICE

BACKGROUND OF THE INVENTION

The present invention relates to semiconductor devices in which a junction termination extension region is utilized to increase the breakdown voltage of the device, and more particularly to a process for fabricating a junction termination extension region.

The maximum reverse voltage that a semiconductor device can withstand is often limited by the breakdown voltage of a reverse-blocking junction included in the device. Such a blocking junction may comprise, for example, a P-N junction of a thyristor, a bipolar transistor, an insulated-gate transistor, or a corresponding junction in a metal-oxide-semiconductor field-effect transistor. Such a blocking junction may also comprise a Schottky barrier rectifying junction in a diode or other device utilizing such a Schottky junction.

To increase the actual breakdown voltage of the P-N variety of blocking junctions in semiconductor devices, so-called junction termination extension (JTE) regions have been incorporated into the devices near a terminated portion of the P-N junction. A JTE region may in general be considered as a more lightly doped extension of a heavily doped semiconductor region that adjoins a lightly doped semiconductor region to form the foregoing P-N junction. The principal function of a JTE region is to reduce the high concentration of electric fields that would otherwise exist in the vicinity of the terminated portion of the P-N junction.

A two-zone JTE region has been described with predicted beneficial results in a report by V. A. K. Temple, entitled "Advanced Light-Triggered Thyristor", EPRI EL-3643, Project 669-2, Final Report (August 1984), pages 8-1 through 8-14. The use of multiple zones in a JTE region achieves the beneficial result of reducing both bulk and surface electric fields in a device protected with a JTE region. This results in an increase in the permissible variance of an implant dose for forming a JTE region, while assuring a high manufacturing yield of devices attaining a high breakdown voltage. Accordingly, the use of multiple zones in a JTE region accommodates uncertainties resulting from further device processing that affect the electrical properties of a JTE region.

While the two-zone JTE region in a semiconductor device as described in the foregoing Temple report predicts beneficial results, it is described in the report as entailing the use of two separate masks to form the two-zone JTE region. The use of multiple masks in device fabrication increases device cost, while decreasing device manufacturing yield, due to mask misalignments that are difficult to avoid.

Accordingly, it would be desirable to provide a single mask capable of being used to form a JTE region with multiple zones.

SUMMARY OF THE INVENTION

It is an object of the present invention to provide a method of facilitating the formation of a multiple-zone junction termination extension (JTE) region in a semiconductor device.

It is a more particular object of the invention to provide a method of forming a multiple-zone JTE region with the use of a single mask.

It is further object of the invention to provide a method for economically forming a JTE region with several zones.

It is yet another object of the invention to provide a method of forming a JTE region that is finely graduated in dopant dosage from one end of the region to the other.

The foregoing and further objects are realized, in preferred form, in a method of fabricating a semiconductor device of the type that includes, when completed, at least one reverse-blocking junction, a voltage-supporting region of one conductivity type having an upper surface and forming one side of the reverse-blocking junction. In the device, the reverse-blocking junction includes a terminated portion at the upper surface of the voltage-supporting region, and the voltage-supporting region at a location adjacent the reverse-blocking junction contains a depletion region of width $W_D$ when the reverse-blocking junction is reverse-biased to its ideal breakdown voltage. The method includes the formation of a mask on the semiconductor device that is used to form a JTE region. The mask formation step comprises configuring the mask to have different patterns of openings exposing differing fractions of area of the semiconductor device at different distances from the terminated portion of the reverse-blocking junction. Adjacent openings in the mask are on center-to-center spacings of less than 0.25 $W_D$. The fabrication method further includes using the mask to form a JTE region atop the first region.

By maintaining the center-to-center spacing of adjacent openings in the foregoing mask at below 0.25 $W_D$, the resulting non-uniformities in doping of the JTE region do not detract, to first order, from JTE performance, since the non-uniformities are then relatively small when averaged over the distance of $W_D$, which can be considered as a measure of charge coupling between the two sides of the reverse-blocking junction.

BRIEF DESCRIPTION OF THE DRAWINGS

While the specification concludes with claims defining the features of the invention that are regarded as novel, it is believed that the invention, together with further objects thereof, will be better understood from the following description in conjunction with the drawing figures, in which:

DESCRIPTION OF THE PREFERRED EMBODIMENTS

Figure 1:
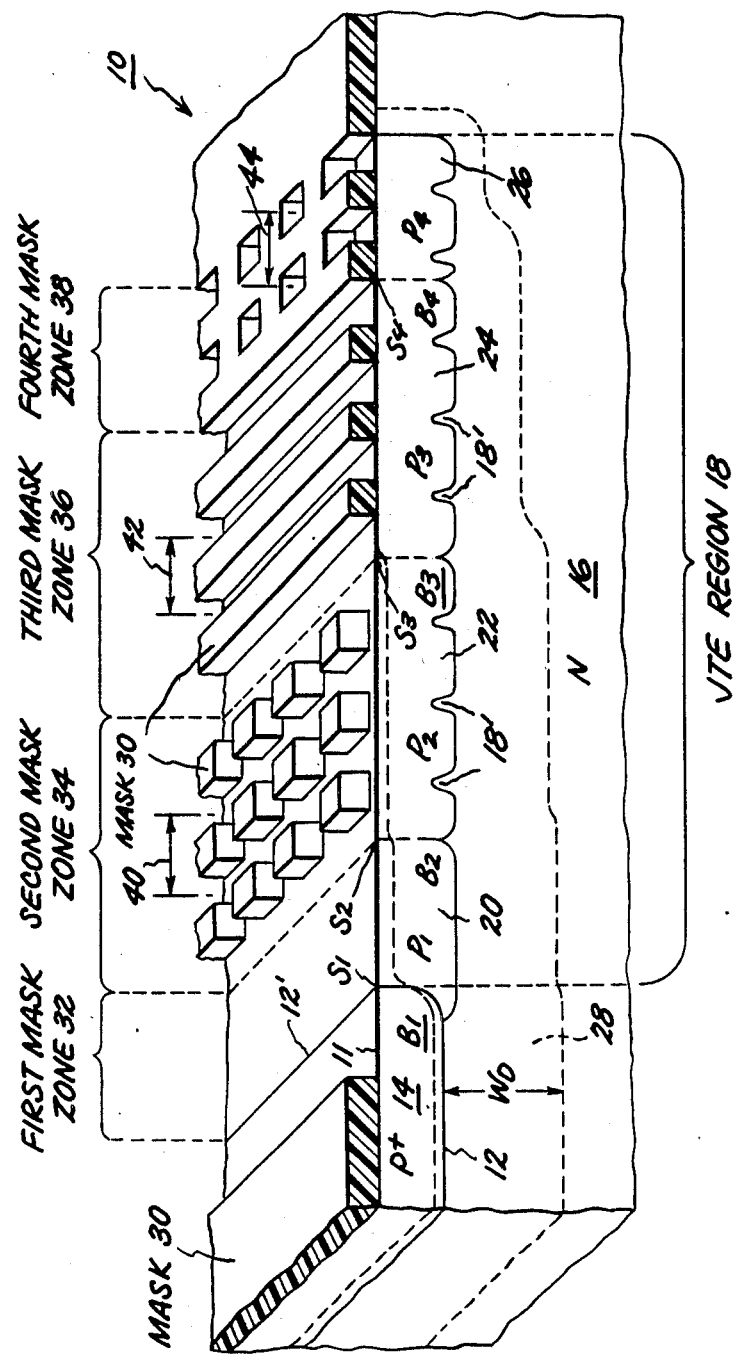
FIG. 1 is a schematic, tridimensional view of a portion of a semiconductor device including a reverse-blocking P-N junction and in which a single mask is utilized for forming a multi-zone junction termination extension region.

FIG. 1 depicts an upper, right portion of a semiconductor device 10 that includes a P-N junction 12, constituting the interface between a P+ region 14 and an N region 16. ("P+" signifies a P-conductivity type region of high dopant concentration, while "N" signifies an N-conductivity type region of moderate to low doping concentration.) N region 16 constitutes a voltage-supporting region of device 10 that supports voltage when device 10 is in a reverseblocking mode. Semiconductor device 10 is shown as having a planar upper surface 11. Alternative configurations for device 10 include nonplanar upper surfaces, such as exemplified in FIGS. 10-32 of U.S. Pat. No. 4,374,389, of common assignee, and the entirety of which is incorporated herein by reference.

Semiconductor device 10 may fail to achieve its ideal breakdown voltage under reverse bias conditions of P-N junction 12 due to excessively high electric fields that are created under reverse bias conditions in the vicinity of terminated portion 12' of P-N junction 12, situated at the upper surface of device 10. Such high electric fields are avoided by the presence of a junction termination extension (JTE) region 18 in semiconductor device 10, which in a preferred embodiment, includes first, second, third, and fourth zones 20, 22, 24, and 26, respectively. In a preferred arrangement, zones 20-26 decrease in dopant concentration or charge per unit area from the first zone 20 to the fourth zone 26. This arrangement of JTE region 18 causes a depletion region 28, surrounding P-N junction 12, to extend from the vicinity of P-N junction 12 all the way to the right of JTE region 18, rather than abruptly terminating near junction termination 12' and thereby resulting in a high concentration of electric fields near such junction termination.

In accordance with the present invention, a doping mask 30 is formed atop semiconductor device 10, and is used in the formation of JTE region 18. Mask 30 comprises four zones having openings exposing semiconductor material of device 10. These zones constitute first zone 32, second zone 34, third zone 36, and fourth zone 38. First mask zone 32 is shown for simplicity as being confined to the area above JTE first zone 20. However, it also may be considered to extend to the left over a portion of P+ region 14. Dopant that is introduced into P+ region 14 in the formation of JTE first zone 20 is inconsequential, however, due to the much higher background doping of P+ region 14. In accordance with the invention, mask 30 is patterned as illustrated, for example, to expose differing fractions of exposed semiconductor surface in the different zones 32-38. The configuration of multi-zone mask 30 as illustrated advantageously permits the formation of a multiple-zone JTE region 18 with a single depant introduction step (not illustrated), such as by implantation or diffusion.

The operability of JTE region 18 depends upon the center-to-center spacing or adjacent openings in mask zones 34, 36, and 38. Such spacing should be less than approximately 0.25 $W_D$, where $W_D$ constitutes the width of depleted region 28 in N region 16, beneath P-N junction 12 when P-N junction 12 is reverse biased to its ideal breakdown voltage. More preferably, such center-to-center spacing is less than approximately 0.1 $W_D$. In second zone 34 the center-to-center spacing of adjacent openings constitutes dimension 40, while in zone 36 such spacing constitutes dimension 42, and in fourth zone 38 such spacing constitutes dimension 44. The invention takes advantage of the fact the resulting nonuniformities in doping of JTE regions 22, 24, and 26 due to the patterned openings of mask 30, shown as undoped peaks 18' of regions 22-26, are negligibly small as long as they are within the foregoing spacing criterion. Peaks 18' could extend all the way to device upper surface 11 without loss in functional capacity of JTE region 18; however, it is preferred that peaks 18' be limited in height as much as feasible.

Mask 30 suitably comprises a conventional photolithographic mask material, such as photoresist, although it alternatively may comprise oxide or metal or other suitable mask material. The illustrated patterns of mask zones 34, 36, and 38 are merely exemplary, and many variations will be apparent to those skilled in the art. The objective is to maintain respective, desired fractional openings in each of mask zones 32, 34, 36, and 38. By way of example, the portion of mask 30 in second zone 34 may be configured as parallel strips of mask material rather than individual blocks of material as illustrated. A typical pattern for mask 30, by way of example, has fractional openings of 100 percent in first zone 32, 65 percent in second zone 34, 50 percent in third zone 36, and 25 percent in fourth zone 38.

In addition to the dopant dosage per unit area, or amount of charge per unit area, in each of the various zones of JTE region 18, the geometry of such regions influences the electrical properties of such zones. In particular, it is desired that first zone 20 and fourth zone 26 each have a width, or lateral dimension in FIG. 1, of between 0.05 $W_D$ (defined above) and 0.5 $W_D$, while second zone 22 and third zone 24 each have a width between 0.5 $W_D$ and 2 $W_D$. Additionally, it is desired that the various zones 20-26 have a lowermost extent, as viewed in FIG. 1, situated approximately at or below the lowermost extent of P-N junction 12. This feature is instrumental in attaining near-ideal breakdown voltage of P-N junction 12. If, on the other hand, JTE zones 20-26 extend downwardly from device upper surface 11 by less than about 25 percent of the vertical height of P+ region 14, the increase in breakdown voltage of P-N junction 12 due to JTE region 18 would be reduced by about 50 percent.

JTE zones 20-26 reduces the likelihood of voltage breakdown of P-N junction 12 in the following manner. First zone 20 prevents premature bulk breakdown at location $B_1$ and premature surface breakdown at location $S_1$. Second zone 22 similarly prevents premature bulk breakdown at location $B_2$ and premature surface breakdown at location $S_2$. This relationship of a JTE zone protecting the adjacent zone nearest junction termination 12' also characterizes third zone 24 and fourth zone 26. The center zones 22 and 24 typically account for more than 90 percent attainment of a high breakdown voltage of P-N junction 12, while the remaining zones 20 and 26 typically account for the remainder.

The multi-zone mask 30 of the present invention greatly facilitates the formation of a multi-zone JTE region, such as multi-zone region 18 of FIG. 1. The value of including multiple zones in a JTE region is primarily that a suitable dopant dosage for forming JTE region 18 is thereby given a wide range of tolerance to accommodate various uncertainties in further processing of device 10. There are two chief causes of such uncertainties in processing of device 10 that may arise.

First, the actual dopant dosage received by JTE region 18 may vary, if, for example, an oxide layer (not shown) overlies semiconductor device 10 when the dopant implant or diffusion is made to form region 18. Such oxide layer may absorb on the order of 20 percent of the dopant that is intended to form region 18, with dopant therein then being rendered inactive. The final dopant dosage in JTE region 18 may further vary during thermal oxidation of semiconductor device 10, wherein the upper portion of JTE region 18 is oxidized and the dopant therein rendered inactive. Second, a passivation layer (not shown) that is typically formed over semiconductor device 10 may inherently include an amount of charge that is difficult to determine due to variations in passivation layer thickness, for example. Such passivation layer charge contributes to the electrical properties of JTE region 18, and may result in a semiconductor device 10 of low breakdown voltage unless an accommodation in charge or doping of JTE region 18 is made. The foregoing uncertainties in processing of semiconductor device 10 may be accommodated by the use of multiple JTE zones, as is now discussed with reference to FIG. 2.

Figure 2:
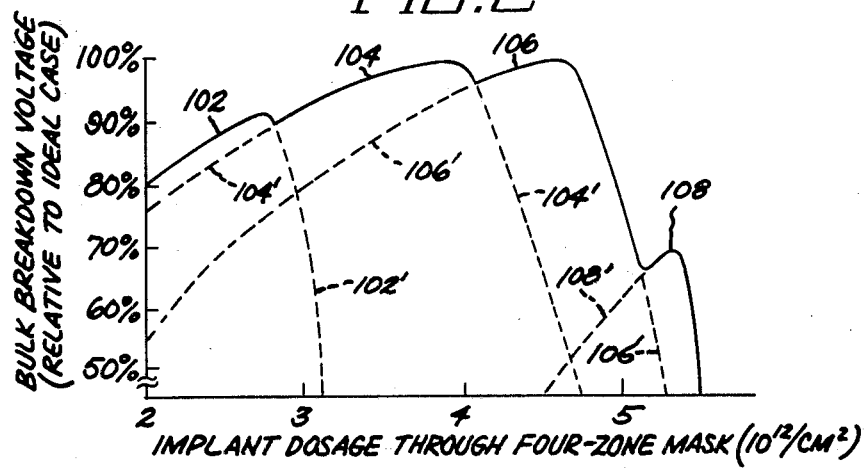
FIG. 2 is a graphical depiction of the permissible variance in implant dosage for forming a junction termination extension region while attaining a high bulk breakdown voltage in a semiconductor device.

In FIG. 2, the breakdown voltage of P-N junction 12 (FIG. 1) is plotted as a function of an implant dosage through a four-zone mask. Such breakdown voltage pertains only to breakdown in the bulk, or interior, of semiconductor device 10, as opposed to surface breakdown of device 10. The problem of surface breakdown voltage is addressed below. In FIG. 2, curve segments 102, 104, 106, and 108 are illustrated as solid lines, and pertain respectively to the electrical properties of first zone 20, second zone 22, third zone 24, and fourth zone 26. The full contribution from each zone includes the appertaining dashed line curve segments, with like reference numerals, although the cumulative effect of multiple zones is represented only by the solid line curve segments. By way of illustration, if JTE zone 34 were the sole zone utilized in JTE region 18, then only curve 104, 104' would determine the bulk breakdown voltage of semiconductor device 10.

Figure 3:
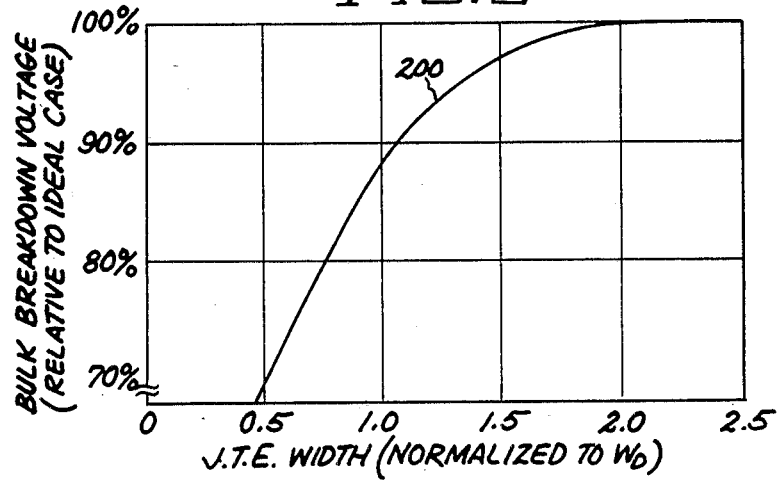
FIG. 3 is a graphical depiction of the effect of varying the width of a zone of a multi-zone junction termination extension region.

It can be appreciated from FIG. 2 that a 90 percent attainment of ideal bulk breakdown voltage of P-N junction 12 (FIG. 1) can be attained with an implant dosage through a four-zone mask that may vary from $3 \times 10^{12}/cm^2$ to $5 \times 10^{12}/cm^2$. Thus, considerable uncertainties in device processing may be accommodated by implanting at a midrange dosage of $4 \times 10^{12}/cm^2$. The data of FIG. 2 is provided by way of example only, and appropriate data for any particular semiconductor device will depend upon the individual structural parameters of such device. However, two important characteristics of FIG. 2 are easily explained with reference thereto. First, the height of the various curves 102-108 of FIG. 2 vary according to the width of the appertaining JTE zone. In general, a wider zone will have a higher curve; more particularly, the approximate expected relation between zone width and curve height is depicted in FIG. 3, which indicates in curve 200 for a typical, multi-zone JTE region the attainment of essentially ideal breakdown voltage at a JTE zone width of twice $W_D$ (defined above). The data of FIG. 3 pertains most particularly to a two-zone JTE region. Second, the sharpness, or lateral extent, of each curve in FIG. 2 varies according to the individual parameters of semiconductor device 10 (FIG. 1), such as the dopant concentration in P+ region 14 at the upper boundary of depletion layer 28 at the ideal breakdown voltage of junction 12. The sharper the curves are in FIG. 2, the more desirable it is to include more JTE zones so as to increase the variance in implant dosage for producing a JTE region of desired effect.

The selection of appropriate dopant dosage for forming JTE region 18 (FIG. 1) may be guided by referring to an article by V. A. K. Temple, entitled "Practical Aspects of the Depletion Etch Method in High-Voltage Devices", *IEEE Transactions in Electron Devices*, Vol. ED-27 (May 1980), pages 977–982, the entirety of which is incorporated herein by reference. The foregoing article describes an approach to terminating a P-N junction by etch removal of the upper portion of a P-conductivity type region. The underlying, unetched region contains charge that corresponds to the charge, or dopant dosage, in JTE region 18.

Figure 4:
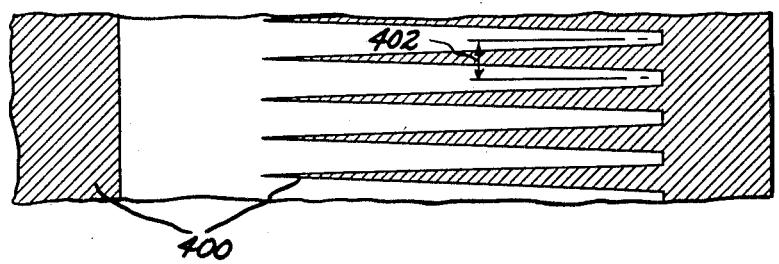
FIG. 4 is a schematic depiction of a mask pattern for forming a finely-graduated junction termination extension region.

Although mask 30 is illustrated as comprising four separate zones of differing fractional openings to semiconductor device 10, mask 30 may alternatively comprise, as illustrated in FIG. 4, a finely-graduated pattern 400 with net opening decreasing from left to right in FIG. 1. As with mask 30 of FIG. 1, mask 400 should have a center-to-center spacing 402 between adjacent openings of less than 0.25 $W_D$ defined above).

If finely-graduated JTE region is incorporated in semiconductor device 10 due to the use of mask pattern 400 of FIG. 4, the FIG. 2 graphical data would constitute a single curve, similar to the solid line curves 102–108 illustrated, without, however, having the discontinuities between adjacent curve segments. The maximum value of such single curve for a finely-graduated JTE region would likely be less than the maximum value of the curve segments illustrated in FIG. 2 for a multi-zone JTE region.

Semiconductor device 10 of FIG. 1 can additionally undergo voltage breakdown due to a phenomenon known as surface breakdown, resulting from reverse-biasing of P-N junction 12. This type of voltage breakdown is usually prevented through the formation of a passivation layer (not shown) over semiconductor device 10. A passivation layer is typically limited in effectiveness to preventing surface breakdown only where the value of electric fields at the surface of a semiconductor device is below a critical level. Accordingly, measures for reducing the intensity of electric fields at the surface of semiconductor device 10 to below such a critical value may be required. In JTE region 18 of FIG. 1, fourth zone 26 already fulfills this purpose by limiting the surface field at location $S_4$ atop third zone 24. If such surface field at location $S_4$ were below the critical value whereby a passivation layer alone would prevent surface breakdown, fourth region 26 could safely be deleted from JTE region 18.

Figure 5:
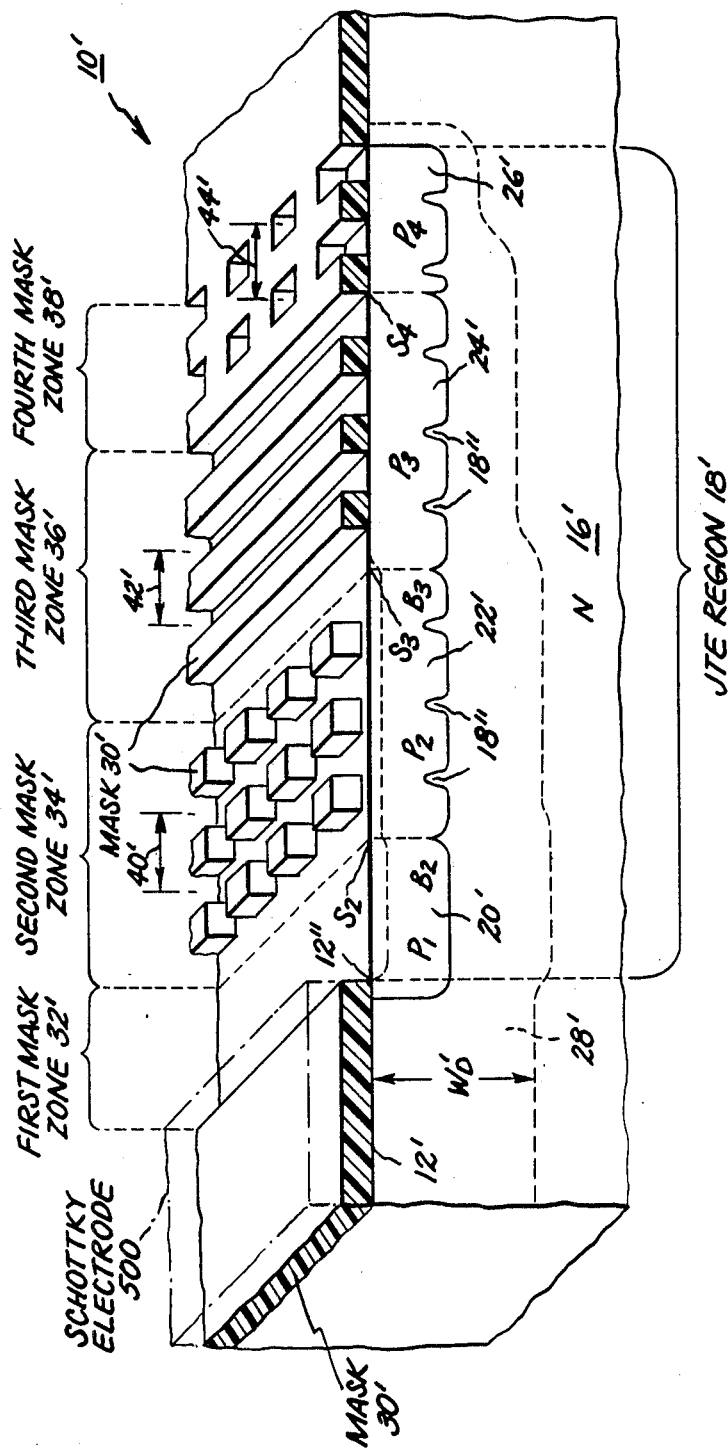
FIG. 5 is a view similar to FIG. 1 of a portion of a semiconductor device including a reverse-blocking Schottky barrier rectifying junction and in which a single mask is utilized for forming a multi-zone junction termination extension region.

FIG. 5 illustrates the application of the present invention to a semiconductor device 10' that includes a Schottky barrier rectifying junction 12'. Device 10' is similar to device 10 of FIG. 1, with like parts as between devices 10' and 10 denoted by like reference numerals. A key difference between devices 10' and 10 is that device 10' includes, when completed, a Schottky electrode 500 (shown in phantom) that adjoins voltage-supporting layer 16' to form a reverse-blocking Schottky barrier rectifying junction 12', while device 10 includes a P+ region 14 that adjoins voltage-supporting region 16 to form a reverse-blocking P-N junction 12. Other than the foregoing difference, the above description, including that pertaining to FIGS. 2 and 3, pertains also to semiconductor device 10'.

The foregoing describes an improved method of fabricating a junction termination extension region adjacent a reverse-blocking junction in a semiconductor device. The improved method greatly facilitates fabrication of multiple-zone JTE regions, and also fabrication of finely-graduated regions. Such resulting JTE regions beneficially permit a wide variance in implant or diffusion doping to form the JTE region, and thereby accommodate uncertainties arising from further processing of a semiconductor device. Accordingly, a high yield, high breakdown voltage semiconductor device is realized.

While the invention has been described with respect to specific embodiments, many modifications and substitutions will occur to those skilled in the art. For example, complementary semiconductor devices could be fabricated, in which N-conductivity type semiconductor material is used in lieu of P-conductivity type semiconductor material, and vice-versa. Additionally, while the mask described herein is taught as being used as a dopant mask to form a JTE region, it could alternatively be used as an etchant mask to form a JTE region by selectively removing semiconductor material of an epitaxial layer, for example. Such an epitaxial layer that may be etched with the present mask is shown in FIG. 18 of above-referenced U.S. Pat. No. 4,374,389, by way of example. It is, therefore, to be understood that the appended claims are intended to cover all such modifications and substitutions as fall within the true spirit and scope of the invention.

What is claimed as the invention and desired to be secured by Letters Patent of the United States is:

1. In a process of fabricating a semiconductor device including, when complete, at least one reverse-blocking junction, a voltage-supporting region of one conductivity type having an upper surface and forming one side of said junction; and wherein said reverse-blocking junction includes a terminated portion at said upper surface of said voltage-supporting region, and said voltage-supporting region at a location beneath said reverse-blocking junction contains a depletion region width $W_D$ when said junction is reverse-biased to its ideal breakdown voltage, the improvement comprising, in combination with the foregoing:
   (a) forming a single mask of not so uniform thickness on said semiconductor device adjacent said terminated portion to be used in forming a junction termination extension region, said step of forming a single mask comprising configuring said mask to expose a percentage x of a first portion of said voltage-supporting region adjacent said terminated portion and to expose a percentage y of a second portion of said voltage-supporting region adjacent said first portion remote from said terminated portion of said reverse-blocking junction, and wherein x is greater than y and adjacent openings in said mask have a center-to-center spacing of less than 0.25 $W_D$; and
   (b) simultaneously doping said first and second portions of said voltage supporting region through said mask with the same concentration of dopant to form in said voltage support region, a first region contiguous with said terminated portion and a second region adjacent said first region, said first and second regions being of approximately the same depth and establishing a junction termination extension wherein the lowermost extent of said junction termination extension is at or below the lowermost extent of said reverse-blocking junction relative to said upper surface of said voltage-supporting layer and each of said first and second regions having a lower dopant dosage per unit volume than any adjacent region more proximate to said terminated portion of said junction.

2. The invention of claim 1, wherein the step of simultaneously doping said first and second portion of said voltage-supporting region through said mask comprises introducing dopant of the opposite conductivity type into said voltage-supporting region through openings in said mask.

3. The invention of claim 1, wherein the mask formation step comprises configuring said mask to have adjacent openings with center-to-center spacings of less than 0.1 $W_D$.

4. The invention of claim 1 wherein said mask formation step further comprises configuring said mask to expose a percentage z of a third portion of said voltage-supporting region, said third portion being adjacent said second portion and more remote from said terminated portion and x is greater than y and y is greater than z.

5. The invention of claim 4, wherein said mask formation step further comprises configuring said mask to expose a percentage A' of a fourth portion of said voltage supporting region adjacent said third portion wherein x y z A', said first, second, third, and fourth regions of said voltage-supporting region underlying respective portions exposed by said mask each region receiving a lower dopant dosage per unit device area than any adjacent region more proximate to said terminated portion of said junction.

6. The invention of claim 5, wherein the zone most proximate to said terminated portion of said reverse-blocking junction has a dimension in a direction extending away from said junction in the range of 0.05 $W_D$ to 0.5 $W_D$.

7. The invention of claim 6, wherein the zone most distant from said terminated portion of said reverse-blocking junction has a dimension in a direction extending away from said junction in the range 0.05 $W_D$ to 0.5 $W_D$.

8. The method of claim 5, wherein said percentage x is approximately 100 percent, said percentage y is approximately 65 percent, said percentage z is approximately 50% and said percentage A' is approximately 25%.

9. The invention of claim 1, wherein said voltage-blocking junction comprises a P-N junction.

10. The invention of claim 1, wherein said reverse-blocking junction comprises a Schottky barrier rectifying junction.

* * * * *